United States Patent
Nakazawa et al.

(10) Patent No.: US 10,950,569 B2
(45) Date of Patent: Mar. 16, 2021

(54) HIGH FREQUENCY MODULE AND COMMUNICATION DEVICE

(71) Applicant: Murata Manufacturing Co., Ltd., Kyoto (JP)

(72) Inventors: Katsunari Nakazawa, Kyoto (JP); Takanori Uejima, Kyoto (JP); Motoji Tsuda, Kyoto (JP); Yuji Takematsu, Kyoto (JP); Dai Nakagawa, Kyoto (JP); Tetsuro Harada, Kyoto (JP); Masahide Takebe, Kyoto (JP); Naoya Matsumoto, Kyoto (JP); Yoshiaki Sukemori, Kyoto (JP); Mitsunori Samata, Kyoto (JP); Yutaka Sasaki, Kyoto (JP); Yuki Fukuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 85 days.

(21) Appl. No.: 16/511,086

(22) Filed: Jul. 15, 2019

(65) Prior Publication Data
US 2020/0051941 A1 Feb. 13, 2020

(30) Foreign Application Priority Data
Aug. 9, 2018 (JP) .............................. JP2018-150626

(51) Int. Cl.
*H03F 3/213* (2006.01)
*H03F 1/30* (2006.01)
(Continued)

(52) U.S. Cl.
CPC .............. *H01L 24/16* (2013.01); *H01L 23/66* (2013.01); *H01L 24/13* (2013.01); *H01L 24/14* (2013.01);
(Continued)

(58) Field of Classification Search
CPC ......... H01L 24/16; H01L 23/66; H01L 24/14; H01L 24/13; H01L 2224/13016;
(Continued)

(56) References Cited

U.S. PATENT DOCUMENTS

| | | | |
|---|---|---|---|
| 7,396,701 B2* | 7/2008 | Shigemura | H01L 23/3121 438/108 |
| 8,742,499 B2* | 6/2014 | Nakajima | H01L 23/66 257/341 |
| 2010/0109052 A1 | 5/2010 | Nakajima et al. | |

FOREIGN PATENT DOCUMENTS

JP 2010-267944 A 11/2010

\* cited by examiner

*Primary Examiner* — Hieu P Nguyen
(74) *Attorney, Agent, or Firm* — Pearne & Gordon LLP

(57) ABSTRACT

A high frequency module includes a transmission power amplifier, a bump electrode connected to a principal surface of the transmission power amplifier and having an elongated shape in a plan view of the principal surface, and a mounting board on which the transmission power amplifier is mounted, wherein the mounting board includes a via conductor having an elongated shape in the plan view, the length direction of the bump electrode and the length direction of the via conductor are aligned in the plan view, and the bump electrode and the via conductor are connected in an overlapping area where the bump electrode and the via conductor overlap at least partially in the plan view, and the overlapping area is an area elongated in the length direction.

20 Claims, 9 Drawing Sheets

(51) Int. Cl.
*H03F 3/68* (2006.01)
*H01L 23/00* (2006.01)
*H01L 23/66* (2006.01)
*H04B 1/04* (2006.01)

(52) U.S. Cl.
CPC ............ *H03F 1/301* (2013.01); *H03F 1/302* (2013.01); *H03F 3/213* (2013.01); *H03F 3/68* (2013.01); *H04B 1/04* (2013.01); *H01L 2223/6644* (2013.01); *H01L 2224/13016* (2013.01); *H01L 2224/13147* (2013.01); *H01L 2224/1403* (2013.01); *H01L 2224/16235* (2013.01); *H01L 2924/1305* (2013.01); *H01L 2924/13091* (2013.01); *H03F 2200/171* (2013.01); *H03F 2200/222* (2013.01); *H03F 2200/294* (2013.01); *H03F 2200/387* (2013.01); *H03F 2200/451* (2013.01); *H04B 2001/0408* (2013.01)

(58) Field of Classification Search
CPC ... H01L 2224/16235; H01L 2224/1403; H01L 2224/13147; H01L 2924/1305; H01L 2924/13091; H01L 2223/6644; H01L 2223/6616; H01L 23/49822; H01L 23/3677; H01L 2224/17519; H01L 2224/13014; H01L 24/17; H01L 2224/13082; H03F 3/213; H03F 3/68; H03F 1/301; H03F 1/302; H03F 2200/294; H03F 2200/171; H03F 2200/451; H03F 2200/387; H03F 2200/222; H03F 3/245; H03F 3/191; H03F 3/19; H03F 3/211; H03F 1/30; H04B 1/04; H04B 2001/0408; H04B 1/006
USPC .................................................. 330/277, 307
See application file for complete search history.

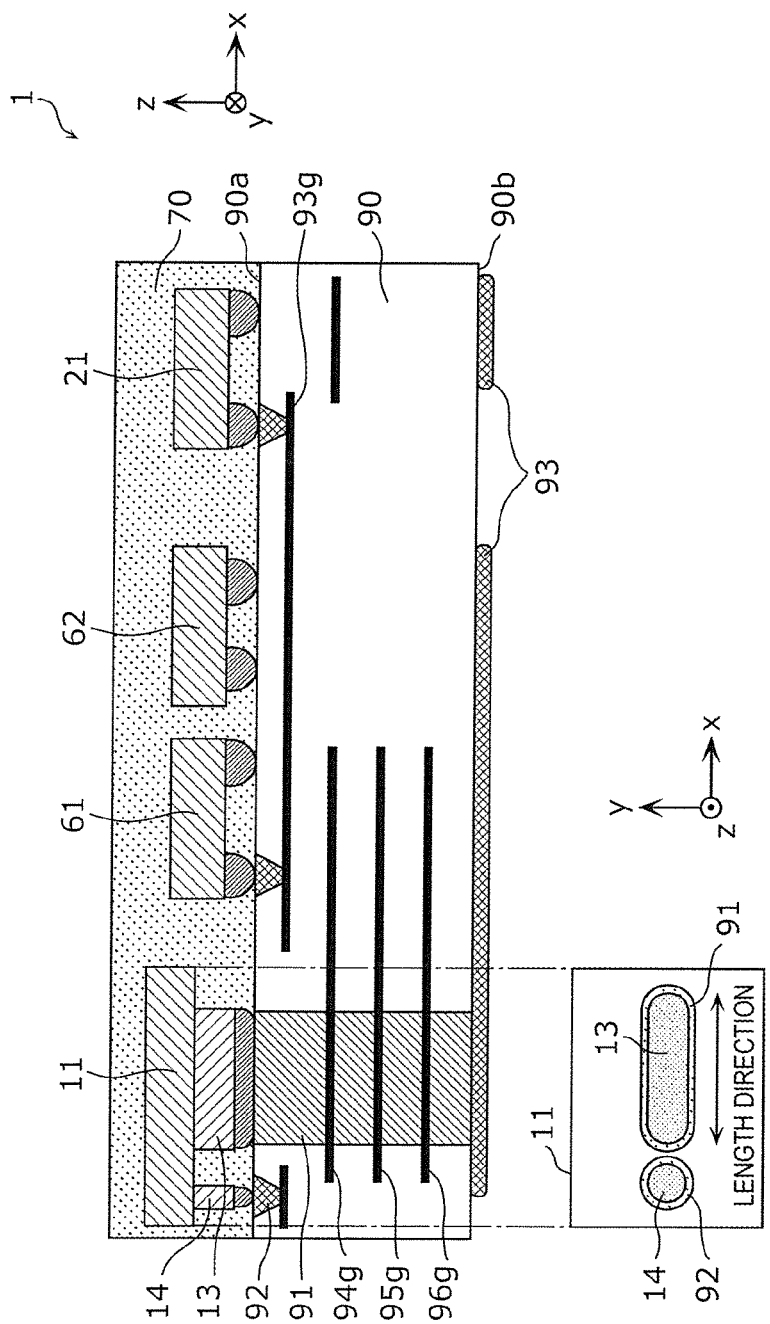

HIGH FREQUENCY MODULE AND COMMUNICATION DEVICE

This application claims priority from Japanese Patent Application No. 2018-150626 filed on Aug. 9, 2018. The content of this application is incorporated herein by reference in its entirety.

BACKGROUND

The present disclosure relates to high frequency modules and communication devices. In mobile communication devices such as cellular phones and the like, particularly, with the development of multi-banding, it is necessary to densely mount circuit elements that form a high frequency front-end circuit. When densely mounting the circuit elements, a heat dissipation measure for an amplifier circuit and a passive element, through which a high frequency signal output from the amplifier circuit passes, becomes important.

Japanese Unexamined Patent Application Publication No. 2010-267944 (Hereinafter, referred to as Patent Document 1) discloses a power amplifier module including a semiconductor chip including a power amplifier circuit and a wiring board on which the semiconductor chip is mounted. A bump electrode connected to a source of the semiconductor chip has a so-called elongated shape in which a plurality of ball bumps is connected in an elongated manner. According to this configuration, the power amplifier module enables to dissipate heat generated at the power amplifier circuit from the bump electrode connected to the source to a backside terminal of the wiring board via a plurality of source vias (VH1S-VH3S) formed in the wiring board.

BRIEF SUMMARY

As in the power amplifier module disclosed in Patent Document 1, for increasing heat dissipation ability, it is effective to form the bump electrode connected to the semiconductor chip into an elongated shape.

However, in the case where the via in the wiring board, which is connected to the foregoing elongated-shape bump electrode, is a typical via conductor having a substantially perfect circle shape in the plan view of the wiring board, the heat dissipation ability of the wiring board is not improved. Accordingly, as a result, heat generated at the semiconductor chip cannot be dissipated effectively via the wiring board.

The present disclosure provides a high frequency module and a communication device with improved heat dissipation ability.

A high frequency module according to embodiments of the present disclosure includes a high frequency component, a first bump electrode connected to the high frequency component, the first bump electrode having an elongated shape in a plan view of the high frequency component, and a mounting board on which the high frequency component is mounted, wherein the mounting board includes a via conductor having an elongated shape in a plan view (viewed in a direction perpendicular to a surface of the mounting board on which the high frequency component is mounted) of the mounting board, a length direction of the first bump electrode and a length direction of the via conductor are aligned in the plan view, and the first bump electrode and the via conductor are connected in an overlapping area where the first bump electrode and the via conductor overlap at least partially in the plan view, and the overlapping area is an area elongated in the length direction.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 2BA is a schematic cross-sectional view of a high frequency module according to an embodiment and FIG. 2BB is a schematic plan view illustrating a first mounting arrangement of a power amplifier;

DETAILED DESCRIPTION

Figure 1:
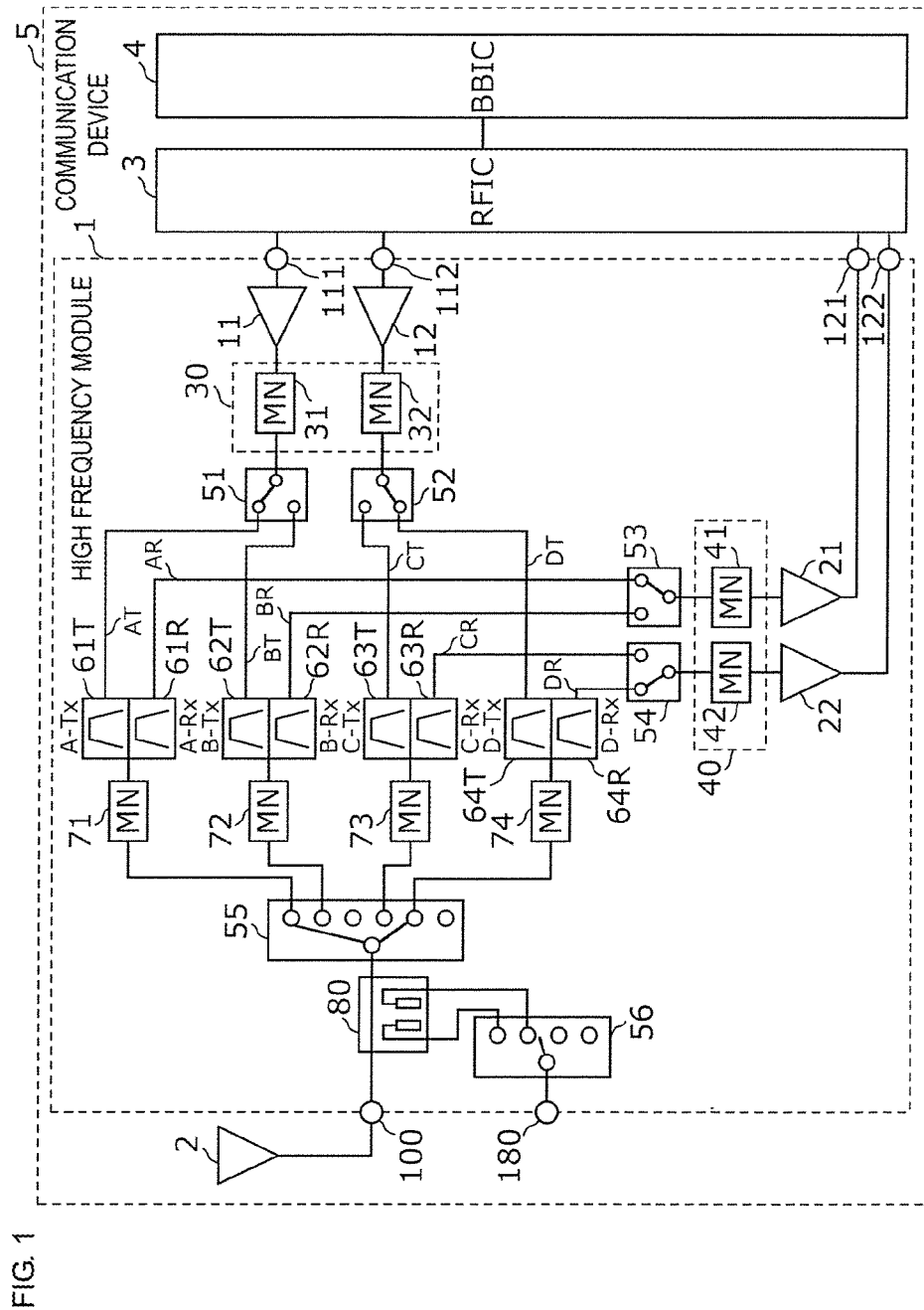
FIG. 1 is a diagram illustrating an exemplary circuit configuration of a high frequency module according to an embodiment.

Hereinafter, an embodiment of the present disclosure and modified examples thereof will be described in detail with reference to the drawings. Note that the embodiment and the modified examples thereof, which will be described below, each illustrates a comprehensive or specific example. Numeric values, shapes, materials, constituting elements, arrangements and connection modes of the constituting elements, and the like illustrated in the following embodiment and modified examples thereof are mere examples, and not intended to limit the present disclosure. Of constituting elements in the following embodiment and modified examples thereof, the constituting elements that are not described in an independent claim will be described as optional constituting elements. Further, dimensions or ratios of dimensions of constituting elements illustrated in the drawings are not necessarily be precise.

Note that, in the following embodiment and modified examples thereof, "A and B are connected" is defined to mean either (1) A and B are in direct contact with each other or (2) A and B are in contact with each other with a conducting film interposed therebetween (A and B are in contact with a top side and a back side of the conducting film, respectively). Further, "A and B are electrically connected" is defined to include a case where A and B are directly or indirectly connected via conductive wiring, and A and B may or may not be in direct contact with each other.

Further, in the following embodiment and the modified examples thereof, with regard to A, B, and C mounted on a board, "C is placed between A and B in the plan view of the board (or a principal surface of the board)" is defined to mean that at least part of a projected area of C in the plan view of the board overlaps a line connecting an arbitrary point in a projected area of A in the plan view of the board and an arbitrary point in a projected area of B in the plan view of the board.

Embodiments

1. Circuit Configuration of High Frequency Module and Communication Device

FIG. 1 is a circuit configuration diagram of a high frequency module 1 according to an embodiment. As illustrated in this figure, a communication device 5 includes the high frequency module 1, an antenna element 2, a RF signal processing circuit (RFIC) 3, and a baseband signal processing circuit (BBIC) 4.

RFIC 3 is a RF signal processing circuit that processes a high frequency signal received or to be transmitted from the antenna element 2. Specifically, RFIC 3 performs signal processing on a high frequency reception signal input via a reception signal path of the high frequency module 1 using down-converting and the like, and outputs a reception signal generated by this signal processing to BBIC 4. Further, RFIC 3 performs signal processing on a transmission signal input from BBIC 4 using up-converting and the like, and outputs a high frequency transmission signal generated by this signal processing to a transmission signal path of the high frequency module 1.

BBIC 4 is a circuit that performs signal processing using an intermediate frequency band, which is at lower frequency than the high frequency signal traveling through the high frequency module 1. The signal having been processed in BBIC 4 is used as, for example, an image signal for image display or an audio signal for communication through a speaker.

Further, RFIC 3 also functions as a controller unit that controls connections of switches 51, 52, 53, 54, 55, and 56 included in the high frequency module 1 based on a communication band (frequency band) to be used. Specifically, RFIC 3 switches the connections of the switches 51 to 56 included in the high frequency module 1 using control signals (not illustrated in the drawing). Alternatively, the controller unit may be provided outside RFIC 3, or may be provided, for example, inside the high frequency module 1 or BBIC 4.

The antenna element 2 is connected to a common terminal 100 of the high frequency module 1, transmits a high frequency signal output from the high frequency module 1, and receives a high frequency signal from outside and outputs to the high frequency module 1.

Note that, in the communication device 5 according to the present embodiment, the antenna element 2 and the BBIC 4 are optional constituting elements.

Next, a detailed configuration of the high frequency module 1 is described.

As illustrated in FIG. 1, the high frequency module 1 includes the common terminal 100, a transmission power amplifiers 11 and 12, reception low-noise amplifiers 21 and 22, transmission filters 61T, 62T, 63T, and 64T, reception filters 61R, 62R, 63R, and 64R, a transmission output matching circuit 30, a reception input matching circuit 40, matching circuits 71, 72, 73, and 74, the switches 51, 52, 53, 54, 55, and 56, a coupler 80, and a coupler output terminal 180.

The common terminal 100 is connected to the antenna element 2.

The transmission power amplifier 11 is a power amplifier that amplifies a high frequency signal in a communication band A and a high frequency signal in a communication band B, the communication band A and the communication band B belonging to a first frequency band group. Further, the transmission power amplifier 12 is a power amplifier that amplifies a high frequency signal in a communication band C and a high frequency signal in a communication band D, the communication band C and the communication band D belonging to a second frequency band group on the high frequency side compared to the first frequency band group.

The reception low-noise amplifier 21 is a low-noise amplifier that performs low-noise amplification of a high frequency signal in the communication band A and a high frequency signal in the communication band B. Further, the reception low-noise amplifier 22 is a low-noise amplifier that performs low-noise amplification of a high frequency signal in the communication band C and a high frequency signal in the communication band D.

The transmission power amplifiers 11 and 12 and the reception low-noise amplifiers 21 and 22, each includes, for example, a field-effect transistor (FET), a heterojunction bipolar transistor (HBT), or the like, which use complementary metal oxide semiconductor (CMOS) or GaAs as a material.

The transmission filter 61T is electrically connected to an output terminal of the transmission power amplifier 11 via the transmission output matching circuit 30 and the switch 51 and, of high frequency transmission signals amplified by the transmission power amplifier 11, allows a high frequency transmission signal in a transmission band of the communication band A to pass. Further, the transmission filter 62T is electrically connected to an output terminal of the transmission power amplifier 11 via the transmission output matching circuit 30 and the switch 51 and, of high frequency transmission signals amplified by the transmission power amplifier 11, allows a high frequency transmission signal in a transmission band of the communication band B to pass. Further, the transmission filter 63T is electrically connected to an output terminal of the transmission power amplifier 12 via the transmission output matching circuit 30 and the switch 52 and, of high frequency transmission signals amplified by the transmission power amplifier 12, allows a high frequency transmission signal in a transmission band of the communication band C to pass. Further, the transmission filter 64T is electrically connected to an output terminal of the transmission power amplifier 12 via the transmission output matching circuit 30 and the switch 52 and, of high frequency transmission signals amplified by the transmission power amplifier 12, allows a high frequency transmission signal in a transmission band of the communication band D to pass.

The reception filter 61R is electrically connected to an input terminal of the reception low-noise amplifier 21 via the reception input matching circuit 40 and the switch 53 and, of high frequency reception signals input from the common terminal 100, allows a high frequency reception signal in a reception band of the communication band A to pass. Further, the reception filter 62R is electrically connected to an input terminal of the reception low-noise amplifier 21 via the reception input matching circuit 40 and the switch 53 and, of high frequency reception signals input from the common terminal 100, allows a high frequency reception signal in a reception band of the communication band B to pass. Further, the reception filter 63R is electrically connected to an input terminal of the reception low-noise amplifier 22 via the reception input matching circuit 40 and the switch 54 and, of high frequency reception signals input from the common terminal 100, allows a high frequency reception signal in a reception band of the communication band C to pass. Further, the reception filter 64R is electrically connected to an input terminal of the reception low-noise amplifier 22 via the reception input matching circuit 40 and the switch 54 and, of high frequency reception signals input from the common terminal 100, allows a high frequency reception signal in a reception band of the communication band D to pass.

Note that the transmission filters 61T to 64T and the reception filters 61R to 64R described above may each be, for example, a surface acoustic wave filter, an acoustic wave filter using a bulk acoustic wave (BAW), a LC resonance filter, or a dielectric filter, but is not limited thereto.

The transmission filter 61T and the reception filter 61R form a duplexer 61 whose passband is the communication band A. Further, the transmission filter 62T and the reception filter 62R form a duplexer 62 whose passband is the communication band B. Further, the transmission filter 63T and the reception filter 63R form a duplexer 63 whose passband is the communication band C. Further, the transmission filter 64T and the reception filter 64R form a duplexer 64 whose passband is the communication band D.

The transmission output matching circuit 30 includes matching circuits 31 and 32. The matching circuit 31 is placed on a transmission path connecting the transmission power amplifier 11 and the transmission filters 61T and 62T and matches the impedance between the transmission power amplifier 11 and the transmission filters 61T and 62T. The matching circuit 32 is placed on a transmission path connecting the transmission power amplifier 12 and the transmission filters 63T and 64T and matches the impedance between the transmission power amplifier 12 and the transmission filters 63T and 64T.

The reception input matching circuit 40 includes matching circuits 41 and 42. The matching circuit 41 is placed on a reception path connecting the reception low-noise amplifier 21 and the reception filters 61R and 62R and matches the impedance between the reception low-noise amplifier 21 and the reception filters 61R and 62R. The matching circuit 42 is placed on a reception path connecting the reception low-noise amplifier 22 and the reception filters 63R and 64R and matches the impedance between the reception low-noise amplifier 22 and the reception filters 63R and 64R.

The switch 51 is placed on a transmission path connecting the matching circuit 31 and the transmission filters 61T and 62T and switches an electrical connection between the transmission power amplifier 11 and the transmission filter 61T and an electrical connection between the transmission power amplifier 11 and the transmission filter 62T. The switch 52 is placed on a transmission path connecting the matching circuit 32 and the transmission filters 63T and 64T and switches an electrical connection between the transmission power amplifier 12 and the transmission filter 63T and an electrical connection between the transmission power amplifier 12 and the transmission filter 64T. The switch 53 is placed on a reception path connecting the matching circuit 41 and the reception filters 61R and 62R and switches an electrical connection between the reception low-noise amplifier 21 and the reception filter 61R and an electrical connection between the reception low-noise amplifier 21 and the reception filter 62R. The switch 54 is placed on a reception path connecting the matching circuit 42 and the reception filters 63R and 64R and switches an electrical connection between the reception low-noise amplifier 22 and the reception filter 63R and an electrical connection between the reception low-noise amplifier 22 and the reception filter 64R.

The switch 55 is placed on a signal path connecting the common terminal 100 and the transmission filters 61T to 64T and the reception filters 61R to 64R and switches: (1) an electrical connection between the common terminal 100 and the transmission filter 61T and the reception filter 61R, (2) an electrical connection between the common terminal 100 and the transmission filter 62T and the reception filter 62R, (3) an electrical connection between the common terminal 100 and the transmission filter 63T and the reception filter 63R, and (4) an electrical connection between the common terminal 100 and the transmission filter 64T and the reception filter 64R. Note that the switch 55 includes a multi-connection-type switch circuit capable of making two or more connections of the foregoing (1) to (4).

The matching circuit 71 is placed on a path connecting the switch 55 and the transmission filter 61T and the reception filter 61R. The matching circuit 72 is placed on a path connecting the switch 55 and the transmission filter 62T and the reception filter 62R. The matching circuit 73 is placed on a path connecting the switch 55 and the transmission filter 63T and the reception filter 63R. The matching circuit 74 is placed on a path connecting the switch 55 and the transmission filter 64T and the reception filter 64R.

The coupler 80 and the switch 56 is a circuit for monitoring power strength of a high frequency signal being transmitted between the common terminal 100 and the switch 55 and outputs the monitored power strength to RFIC 3 or the like via the coupler output terminal 180.

The foregoing circuit configuration enables the high frequency module 1 to perform a simultaneous transmission, a simultaneous reception, or a simultaneous transmission-and-reception of a high frequency signal of the communication band A or the communication band B and a high frequency signal of the communication band C or the communication band D.

Note that the transmission filters 61T to 64T, the reception filters 61R to 64R, the transmission power amplifier 12, the reception low-noise amplifiers 21 and 22, the matching circuits 31, 32, 41, 42, 71 to 74, the coupler 80, the switches 51 to 56, and the coupler output terminal 180 are optional constituting elements of the high frequency module according to the present disclosure. That is, the high frequency module 1 according to the present embodiment only needs to be a circuit that transmits a high frequency signal of the communication band A and has a characteristic feature in a connection structure between the transmission power amplifier 11 and a mounting board (illustrated in FIG. 2A and FIGS. 2BA and 2BB) on which the transmission power amplifier 11 is mounted.

2. Circuit Element Arrangement Configuration of High Frequency Module 1

Figure 2A:
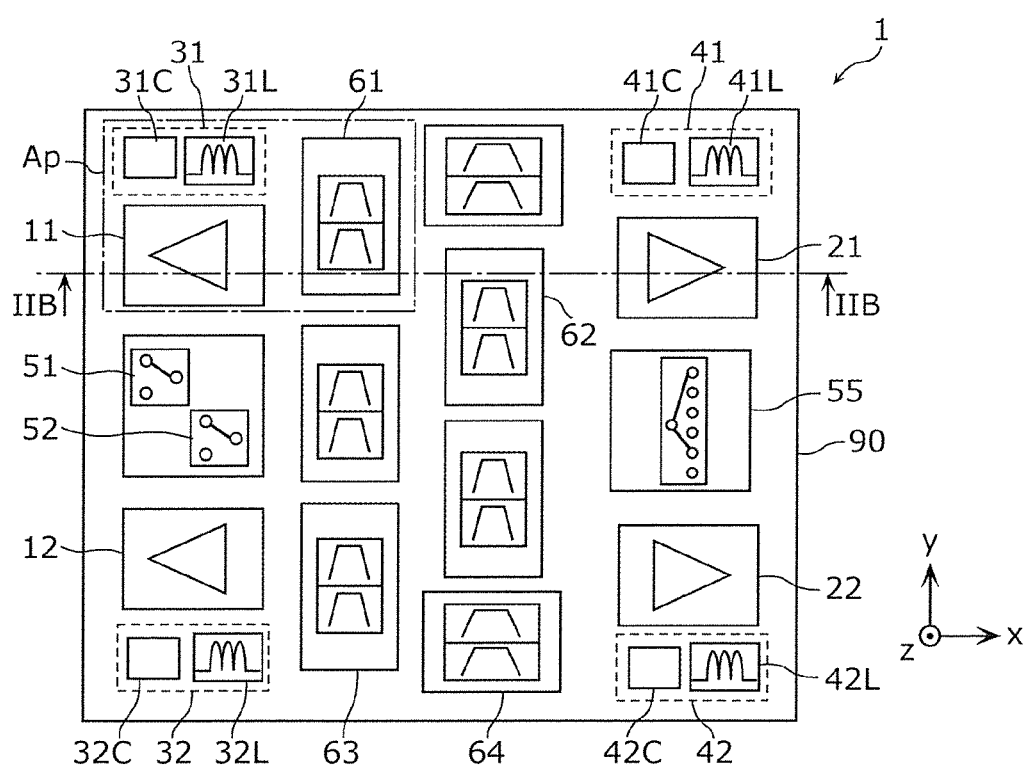
FIG. 2A is a schematic plan view illustrating a circuit arrangement of a high frequency module according to an embodiment.

FIG. 2A is a schematic configuration plan view (when viewed in a direction perpendicular to a principal surface of a mounting board 90) illustrating a circuit arrangement of the high frequency module 1 according to the embodiment. FIG. 2BA is a schematic cross-sectional view of the high frequency module 1 according to the embodiment and FIG. 2BB is a schematic plan view illustrating a first mounting arrangement of the transmission power amplifier 11. More specifically, FIG. 2BA is a cross-sectional view of FIG. 2A along the line IIB-IIB, FIG. 2BB is a plan view of an area Ap on a principal surface 90a, where the transmission power amplifier 11 is mounted.

As illustrated in FIG. 2A and FIGS. 2BA and 2BB, the high frequency module 1 according to the embodiment includes, in addition to the circuit configuration illustrated in FIG. 1, the mounting board 90 and a resin member 70.

The mounting board 90 has the principal surface 90a and a principal surface 90b, which are arranged back to back, and is a board on which the circuit elements illustrated in FIG. 1 are mounted. As the mounting board 90, for example, a multilayer board composed of resin, a low temperature co-fired ceramics (LTCC) multilayer board made up of a plurality of dielectric layers, or the like is used.

The resin member 70 is placed on the principal surface 90a of the mounting board 90, covers the circuit elements mounted on the principal surface 90a and the principal surface 90a of the mounting board 90, and has a functionality that ensures reliability such as mechanical strength, humidity resistance, and the like of the foregoing circuit elements. Note that the resin member 70 is an optional constituting element of the high frequency module according to the present disclosure.

As illustrated in FIG. 2A and FIGS. 2BA and 2BB, in the high frequency module 1 according to the present embodiment, the transmission power amplifiers 11 and 12, the reception low-noise amplifiers 21 and 22, the duplexers 61 to 64, the matching circuits 31, 32, 41, and 42, and the switches 51, 52, and 55 are surface-mounted on the principal surface 90a of the mounting board 90. Alternatively, the transmission power amplifier 12, the reception low-noise amplifiers 21 and 22, the duplexers 61 to 64, the matching circuits 31, 32, 41, and 42, and the switches 51, 52, and 55 may be mounted on the principal surface 90b of the mounting board 90. Further, although it is not illustrated in FIG. 2A or FIG. 2BA or 2BB, the switches 53, 54, and 56, the matching circuits 71 to 74, and the coupler 80 may be surface-mounted on either the principal surface 90a or the principal surface 90b of the mounting board 90, or may be embedded in the mounting board 90.

The matching circuit 31 includes an inductor 31L and a capacitor 31C. The matching circuit 32 includes an inductor 32L and a capacitor 32C. The matching circuit 41 includes an inductor 41L and a capacitor 41C. The matching circuit 42 includes an inductor 42L and a capacitor 42C.

As illustrated in FIG. 2A, in the plan view of the mounting board 90, the transmission power amplifiers 11 and 12, the matching circuits 31 and 32, and the switch 51 and 52, which are transmission circuit elements, are placed in a left-side area of the mounting board 90. On the other hand, the reception low-noise amplifiers 21 and 22 and the matching circuits 41 and 42, which are reception circuit elements, are placed in a right-side area of the mounting board 90. Further, in the plan view of the principal surface 90a of the mounting board 90, the duplexers 61 to 64 are placed (in a center area) between the transmission circuit elements and the reception circuit elements. This allows a transmission system circuit and a reception system circuit of the high frequency module 1 to be separated from each other with the duplexers interposed therebetween and enables to improve isolation between the transmission system circuit and the reception system circuit.

Further, as illustrated in FIGS. 2BA and 2BB, the high frequency module 1 includes a bump electrode 13 (first bump electrode) connected to a principal surface of the transmission power amplifier 11 and having an elongated shape in the plan view of this principal surface.

Further, the mounting board 90 includes a via conductor 91 having an elongated shape in the plan view of the mounting board 90. The via conductor 91 is a conductor that penetrates through the mounting board 90 from the principal surface 90a to the principal surface 90b.

Here, as illustrated in FIG. 2BB, the length direction of the bump electrode 13 and the length direction of the via conductor 91 are aligned in the foregoing plan view, and the bump electrode 13 and the via conductor 91 are connected in an overlapping area where the bump electrode 13 and the via conductor 91 overlap at least partially in the foregoing plan view. The overlapping area is an area elongated in the foregoing length direction. Here, "the overlapping area elongated in the foregoing length direction" is an area where a partial area of the bump electrode 13 elongated in the foregoing length direction, out of the area of the bump electrode 13 in the foregoing plan view, and a partial area of the via conductor 91 elongated in the foregoing length direction, out of the area of the via conductor 91 in the foregoing plan view, overlap. Further, "the length directions are aligned" is not limited to the state where the length direction of the via conductor 91 and the length direction of the bump electrode 13 are substantially parallel to each other, but also includes the state where an angle formed by the length direction of the via conductor 91 and the length direction of the bump electrode 13 is equal to or less than 45 degrees.

That is, the high frequency module 1 according to the present embodiment includes the transmission power amplifier 11, the bump electrode 13 having an elongated shape in the foregoing plan view, and the mounting board 90, the mounting board 90 includes the via conductor 91 having an elongated shape in the foregoing plan view, the length direction of the bump electrode 13 and the length direction of the via conductor 91 are aligned in the foregoing plan view, and the bump electrode 13 and the via conductor 91 are connected in the overlapping area where the bump electrode 13 and the via conductor 91 overlap at least partially. Here, the overlapping area is an area elongated in the foregoing length direction.

Note that the elongated shape is a shape elongated in one direction, and the length direction denotes this direction.

This enables to connect the elongated-shape bump electrode 13 and the elongated-shape via conductor 91 in such a way that the bump electrode 13 and the via conductor 91 overlap at least partially in the foregoing plan view. Therefore, compared with the related art, the contact area between the bump electrode 13 and the via conductor 91 becomes larger. Accordingly, the improvement of the heat dissipation ability of the high frequency module 1 becomes possible.

Note that the bump electrode 13 is, for example, a columnar electrode whose main component is copper (Cu). This enables the bump electrode 13 to be formed easily into the foregoing elongated shape using electrolytic or non-electrolytic plating or the like, and also enables to reduce thermal resistance compared with other metallic materials. Accordingly, simplification of the fabrication process and further improvement of the heat dissipation ability are achieved.

Further, in the high frequency module 1 according to the present embodiment, ground electrodes 93g to 96g formed in inner layers of the mounting board 90 and backside ground electrodes 93 formed on the principal surface 90b of the mounting board are formed in the mounting board 90. The ground electrode 93g is an inner-layer ground pattern formed in the first layer from the principal surface 90a of the mounting board 90. The ground electrode 94g is an inner-layer ground pattern formed in the second layer from the principal surface 90a of the mounting board 90. The ground electrode 95g is an inner-layer ground pattern formed in the third layer from the principal surface 90a of the mounting board 90. The ground electrode 96g is an inner-layer ground pattern formed in the fourth layer from the principal surface 90a of the mounting board 90. The backside ground electrode 93 is a conductor pattern formed on the principal surface 90b of the mounting board 90 and is connected to the via conductor 91.

Here, the ground electrode 94g to 96g are connected to the via conductor 91 and to other circuit elements as needed (not illustrated). On the other hand, the ground electrode 93g is connected to other circuit elements such as the duplexer 61, the reception low-noise amplifier 21, and the like, but is not connected to the via conductor 91. That is, the via conductor 91 for dissipating heat from the transmission power amplifier 11 is not connected to the ground electrode 93g formed in the first layer of the mounting board 90, but is connected to the ground electrodes 94g to 96g formed in the second and succeeding layers of the mounting board 90. This suppresses dissipation of heat generated at the transmission power amplifier 11 via the ground electrode 93g near the transmission power amplifier 11. Accordingly, it becomes possible to suppress heat received by circuit elements other than the transmission power amplifier 11, which form the high frequency module 1, the heat being generated at the transmission power amplifier 11, thereby ensuring highly accurate circuit operation of the high frequency module 1.

Figure 3:
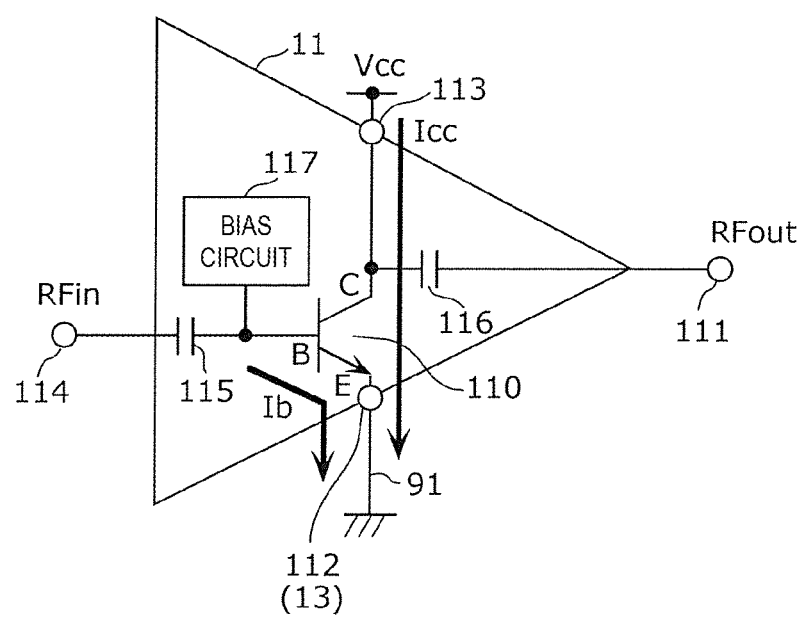
FIG. 3 is a circuit configuration diagram of a power amplifier according to an embodiment.

FIG. 3 is a circuit configuration diagram of the transmission power amplifier 11 according to the embodiment. As illustrated in this figure, the transmission power amplifier 11 includes an amplifier transistor 110, capacitors 115 and 116, a bias circuit 117, a collector terminal 113, an emitter terminal 112, an input terminal 114, and an output terminal 111.

The amplifier transistor 110 is, for example, a grounded-emitter type bipolar transistor including a collector, an emitter, and a base, and is an amplifier element that amplifies a high frequency current input to the base and outputs the amplified high frequency current from the collector. Alternatively, the amplifier transistor 110 may be a field-effect type transistor including a drain (corresponding to the collector), a source (corresponding to the emitter), and a gate (corresponding to the base).

The capacitor 115 is a DC-cut capacitor element and has a functionality to prevent leakage of a direct current to the input terminal 114 using a direct-current bias voltage applied to the base from the bias circuit 117.

The capacitor 116 is a DC-cut capacitor element, has a functionality to remove a direct-current component of an amplified high frequency signal to which the direct-current bias voltage is superposed, and outputs, from the output terminal 111, an amplified high frequency signal from which the direct-current component has been removed.

The bias circuit 117 is connected to the base of the amplifier transistor 110 and has a functionality to optimize an operation point of the amplifier transistor 110 by applying the bias voltage to the base.

The emitter terminal 112 is connected to the bump electrode (first bump electrode) and to ground via the bump electrode 13 and the via conductor 91.

According to the foregoing circuit configuration of the transmission power amplifier 11, a high frequency signal RFin input from the input terminal 114 forms a base current Ib flowing from the base to the emitter of the amplifier transistor 110. The base current Ib is amplified by the amplifier transistor 110 and forms a collector current Icc, and a high frequency signal RFout corresponding to the collector current Icc is output from the output terminal 111. At this time, a large current obtained by adding the base current Ib and the collector current Icc flows from the emitter terminal 112 to the ground. Accordingly, in order to improve the heat dissipation ability of the transmission power amplifier 11, it is necessary to improve the heat dissipation ability of the emitter terminal 112 that needs to function as a heat dissipating part of the amplifier transistor 110.

In response to this, since the emitter terminal 112 through which the large current flows is connected to the ground via the bump electrode 13 (first bump electrode) and the via conductor 91, it becomes possible to effectively increase the heat dissipation ability of the transmission power amplifier 11.

Further, as illustrated in FIGS. 2BA and 2BB, the high frequency module 1 according to the present embodiment further includes a bump electrode 14 (second bump electrode) connected to a principal surface of the transmission power amplifier 11. The bump electrode 14 is connected to the output terminal 111 or the collector terminal 113 or both of the transmission power amplifier 11. Further, the bump electrode 14 is connected to a substantially circular via conductor 92 formed in the mounting board 90. Here, in the foregoing plan view, the area of the bump electrode 13 (first bump electrode) is larger than the area of the bump electrode 14 (second bump electrode).

According to this, the area of the bump electrode 13 in the foregoing plan view, where a large current flows, is larger than the area of the bump electrode 14 in the foregoing plan view, where a high frequency signal or a power supply voltage Vcc is applied, thereby optimizing the heat dissipation ability of the transmission power amplifier 11.

Figure 4:
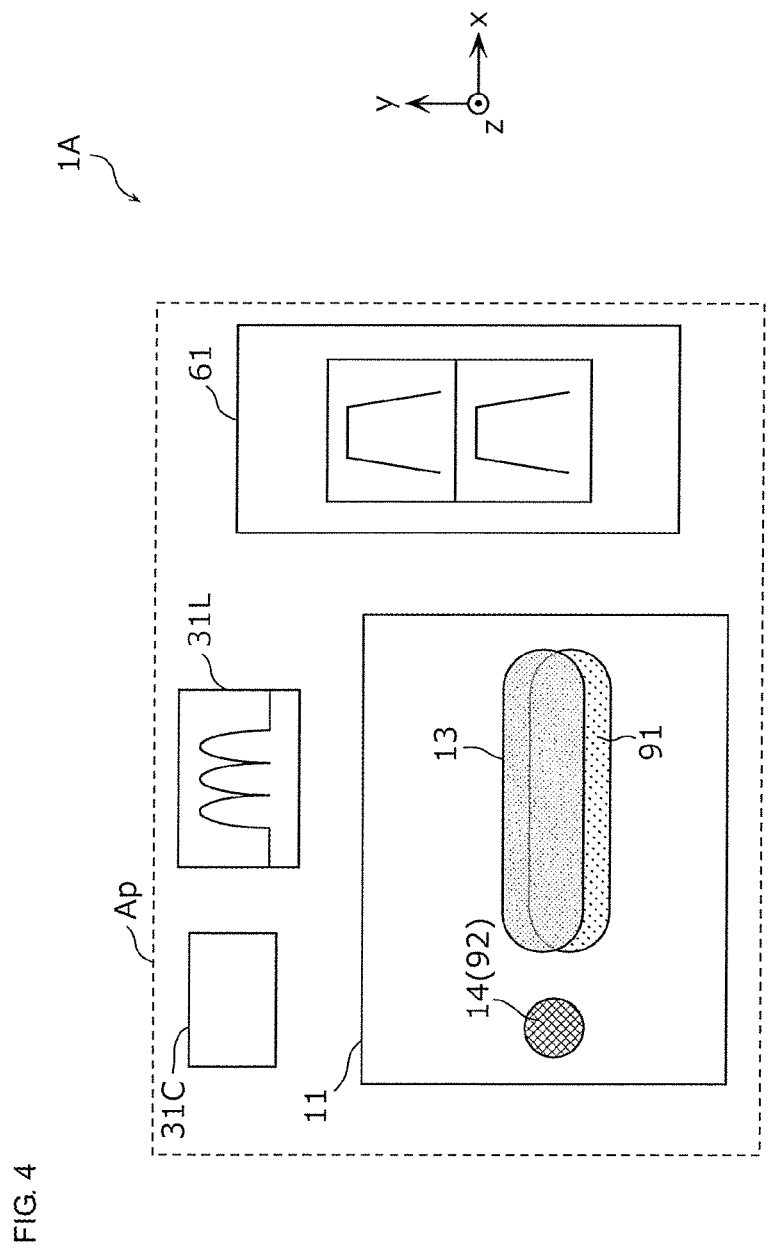
FIG. 4 is a schematic plan view illustrating a second mounting arrangement of a power amplifier included in a high frequency module according to a modified example 1 of an embodiment.

FIG. 4 is a schematic plan view illustrating a second mounting arrangement of the transmission power amplifier 11 included in a high frequency module 1A according to a modified example 1 of the embodiment. This figure is a first modified example of the electrode connection configuration in the principal surface 90a of an area Ap where the transmission power amplifier 11 is mounted. Compared with the first mounting arrangement of the transmission power amplifier 11 illustrated in FIG. 2BB, the second mounting arrangement of the transmission power amplifier 11 illustrated in FIG. 4 is different in spatial relationship between the bump electrode 13 and the via conductor 91.

The mounting board 90 includes, in addition to the foregoing via conductors 91 and 92, a non-conducting part in contact with the periphery of the via conductor 91, the non-conducting part being a main body of the mounting board 90. In the case where the mounting board 90 is a multilayer board composed of a resin, the non-conducting part of the mounting board 90 is, for example, a resin member forming the main body of the multilayer board. Further, in the case where the mounting board 90 is a LTCC board, the non-conducting part is a ceramic member forming the main body of the LTCC board.

In the second mounting arrangement of the transmission power amplifier 11 according to the present modified example, the bump electrode 13 includes an area that does not overlap the via conductor 91 but overlaps the non-conducting part in the foregoing plan view. That is, as illustrated in FIG. 4, the length direction of the bump electrode 13 and the length direction of the via conductor 91 are aligned, but the bump electrode 13 and the via conductor 91 do not overlap completely.

The elongated-shape via conductor 91 is formed by opening a hole in the mounting board 90 using a laser or the like and then filling the hole with a conducting member (for example, conductive paste) such as silver (Ag), copper (Cu), or the like, or using a similar method. Since the elongated-shape via conductor 91 does not have a perfect circle shape in the foregoing plan view, the amount of conducting filling in a via-inner-circumference area is less than that of a via-outer-circumference area in some cases when filling a conducting member at the time of formation of the via conductor 91. Because of this, it is expected that a depressed part is likely to be formed on the principal surface 90a of the mounting board 90 in the via-inner-circumference area compared with the via-outer-circumference area, thereby making it difficult to ensure the flatness of the via conductor 91 on the principal surface 90a of the mounting board 90. On the other hand, the flatness of the non-conducting part surrounding the via conductor 91 in the foregoing plan view is being ensured on the principal surface 90a of the mounting board 90.

According to the second mounting arrangement, in the foregoing plan view, the bump electrode 13 partially overlaps the via conductor 91 and further overlap the non-conducting part at the remaining part. Because of this, it becomes possible to ensure the flatness of the transmission power amplifier 11 on the mounting board 90 by connecting the bump electrode 13 and the non-conducting part while improving the heat dissipation ability of the high frequency module 1A by connecting the bump electrode 13 and the via conductor 91.

Further, since the bump electrode 13 and the via conductor 91 do not need to overlap completely, the arrangement position of the via conductor 91 in the mounting board 90 can be selected freely to some extent, thereby enabling to change a heat dissipating area within the mounting board 90. Particularly, this enables to place the via conductor 91 away from a component whose characteristics change greatly due to heat or a similar component, thereby stabilizing electrical characteristics of the high frequency module 1A.

Alternatively, the area of the via conductor 91 on the principal surface 90a may be reduced to less than the area of the bump electrode 13. This enables to downsize the via conductor 91, thereby improving flexibility in wiring design inside the mounting board 90.

Figure 5:
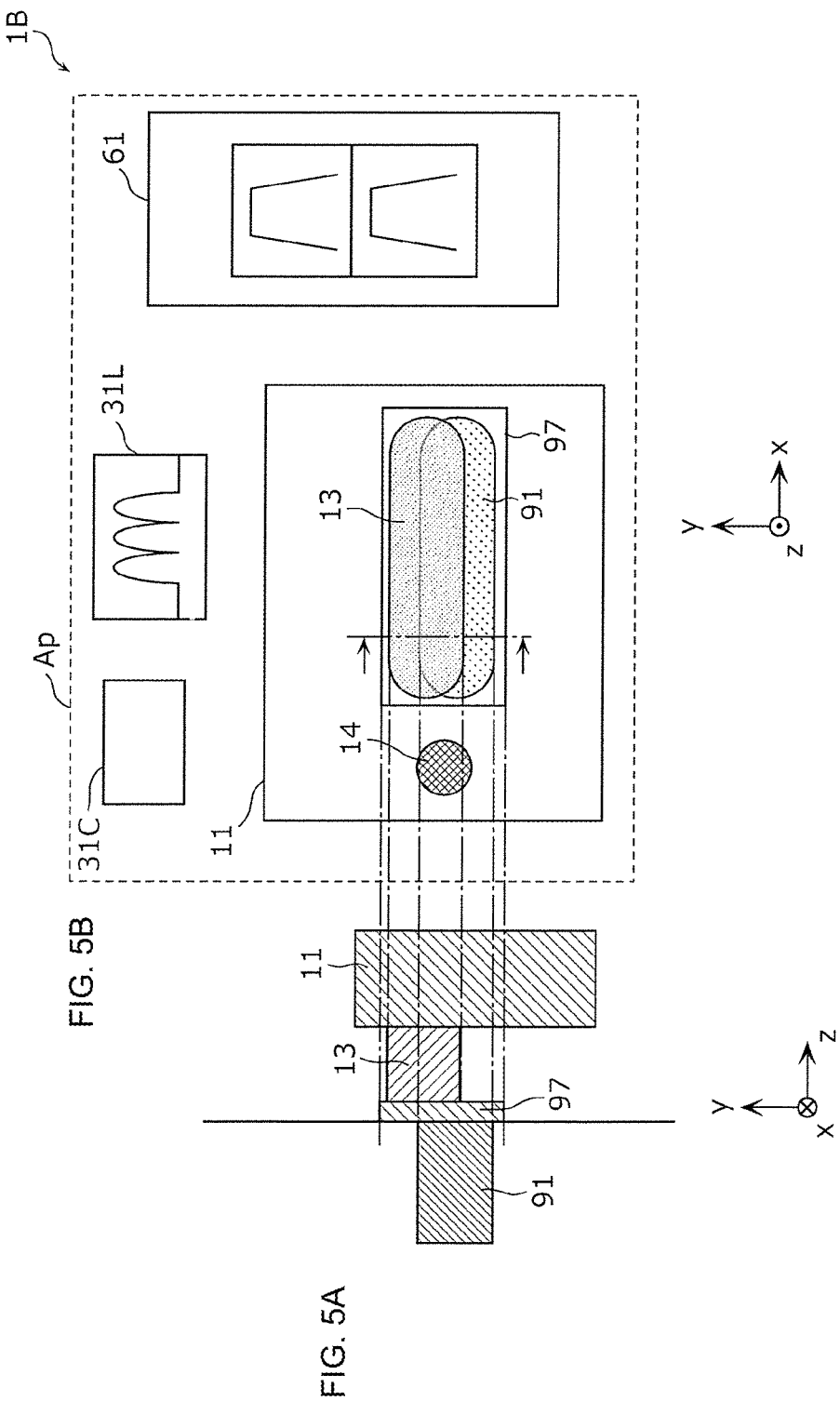
FIGS. 5A and 5B are schematic plan views and a schematic cross-sectional view illustrating a third mounting arrangement of a power amplifier included in a high frequency module according to a modified example 2 of an embodiment.

FIGS. 5A and 5B are schematic plan views and a cross-sectional view illustrating a third mounting arrangement of the transmission power amplifier 11 included in a high frequency module 1B according to a modified example 2 of the embodiment. This figure is a second modified example of the electrode connection configuration in the principal surface 90a of the area Ap where the transmission power amplifier 11 is mounted. Compared with the second mounting arrangement of the transmission power amplifier 11 illustrated in FIG. 4, the third mounting arrangement of the transmission power amplifier 11 illustrated in FIGS. 5A and 5B are different in that a connection electrode 97 is placed between the bump electrode 13 and the via conductor 91.

The connection electrode 97 is a conductor electrode placed on the principal surface 90a of the mounting board 90, and is, as illustrated in FIG. 5A, a plane conducting layer interposed between the bump electrode 13 and the via conductor 91 in a cross-sectional view and connecting the bump electrode 13 and the via conductor 91. Further, as illustrated in FIG. 5B, in the foregoing plan view, the connection electrode 97 contains the bump electrode 13 and further contains the via conductor 91.

Note that, as with the second mounting arrangement, in the third mounting arrangement, the bump electrode 13 includes an area that does not overlap the via conductor 91 but overlaps the non-conducting part in the foregoing plan view. That is, as illustrated in FIGS. 5A and 5B, the length direction of the bump electrode 13 and the length direction of the via conductor 91 are aligned, but the bump electrode 13 and the via conductor 91 do not overlap completely.

According to the third mounting arrangement, in the foregoing plan view, the bump electrode 13 partially overlaps the via conductor 91 and further overlap the non-conducting part at the remaining part, and further the connection electrode 97 contains the bump electrode 13 and the via conductor 91 in the foregoing plan view. That is, connecting the bump electrode 13 and the via conductor 91 via the connection electrode 97 enables to improve connection reliability between the bump electrode 13 and the via conductor 91, thereby further improving the heat dissipation ability of the high frequency module 1B. Further, flexibility in arrangement position of the via conductor 91 in the mounting board 90 is ensured. In addition, connecting the bump electrode 13 and the non-conducting part enables to ensure the flatness of the transmission power amplifier 11 on the mounting board 90.

Figure 6:
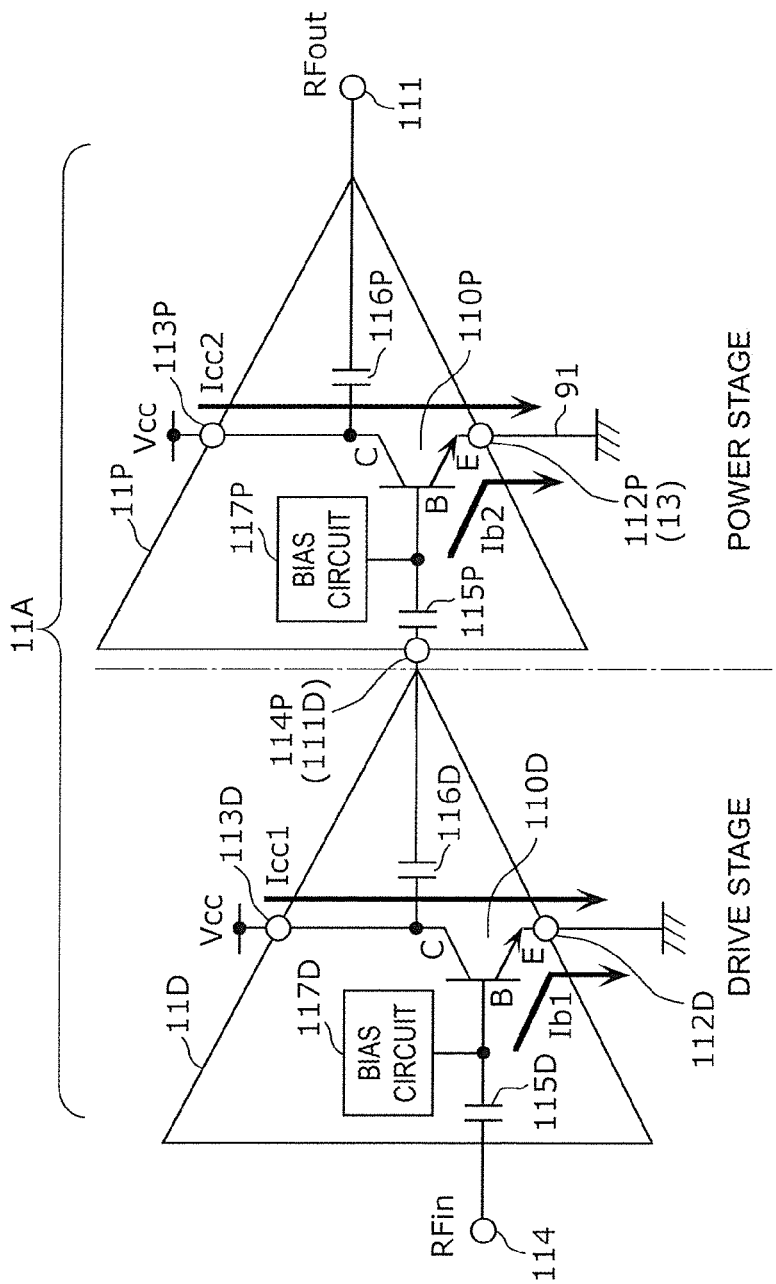
FIG. 6 is a circuit configuration diagram of a power amplifier included in a high frequency module according to a modified example 3 of an embodiment.

3. Circuit Configuration and Electrode Arrangement Configuration of Multiple-Stage Power Amplifier FIG. 6 is a circuit configuration diagram of a transmission power amplifier 11A included in a high frequency module 1C according to a modified example 3 of the embodiment. The transmission power amplifier 11A according to the present modified example has a configuration including two stages of amplifier transistors forming a cascading connection with each other. As illustrated in FIG. 6, the transmission power amplifier 11A includes a first power amplifier 11P and a second power amplifier 11D.

The first power amplifier 11P includes an amplifier transistor 110P, capacitors 115P and 116P, a bias circuit 117P, a collector terminal 113P, an emitter terminal 112P, an input terminal 114P, and an output terminal 111.

The amplifier transistor 110P is a first amplifier element placed in the last stage (power stage) of a plurality of amplifier transistors and is, for example, a grounded-emitter type bipolar transistor including a collector, an emitter, and a base, and amplifies a high frequency current input to the base and outputs the amplified high frequency current from the collector. Alternatively, the amplifier transistor 110P may be a field-effect type transistor including a drain (corresponding to the collector), a source (corresponding to the emitter), and a gate (corresponding to the base).

The second power amplifier 11D includes an amplifier transistor 110D, capacitors 115D and 116D, a bias circuit 117D, a collector terminal 113D, an emitter terminal 112D, an input terminal 114, and an output terminal 111D.

The amplifier transistor 110D is a second amplifier element placed in a preceding stage (drive stage) followed by the amplifier transistor 110P placed in the last stage and is, for example, a grounded-emitter type bipolar transistor including a collector, an emitter, and a base, and amplifies a high frequency current input to the base and outputs the amplified high frequency current from the collector. Alternatively, the amplifier transistor 110D may be a field-effect type transistor including a drain (corresponding to the collector), a source (corresponding to the emitter), and a gate (corresponding to the base).

The capacitors 115P and 115D are each a DC-cut capacitor element and each has a functionality similar to that of the capacitor 115. The capacitors 116P and 116D are each a DC-cut capacitor element and each has a functionality similar to that of the capacitor 116. The bias circuits 117P and 117D are respectively connected to the bases of the amplifier transistors 110P and 110D and each has a functionality similar to that of the bias circuit 117.

Here, the emitter terminal 112P is connected to the bump electrode 13 and to the ground via the bump electrode 13 and the via conductor 91.

According to the foregoing circuit configuration of the transmission power amplifier 11A according to the present modified example, a high frequency signal RFin input from the input terminal 114 becomes a base current Ib1 flowing from the base to the emitter of the amplifier transistor 110D. The base current Ib1 is amplified by the amplifier transistor 110D and forms a collector current Icc1, and a high frequency signal corresponding to the collector current Icc1 is output from the output terminal 111D (input terminal 114P). Further, the high frequency signal amplified by the amplifier transistor 110D forms a base current Ib2 flowing from the base to the emitter of the amplifier transistor 110P through the input terminal 114P. The base current Ib2 is amplified by the amplifier transistor 110P and forms a collector current Icc2, and a high frequency signal corresponding to the collector current Icc2 is output from the output terminal 111. At this time, a large current obtained by adding the base current Ib2 and the collector current Icc2 flows from the emitter terminal 112P to the ground.

Figure 7A:
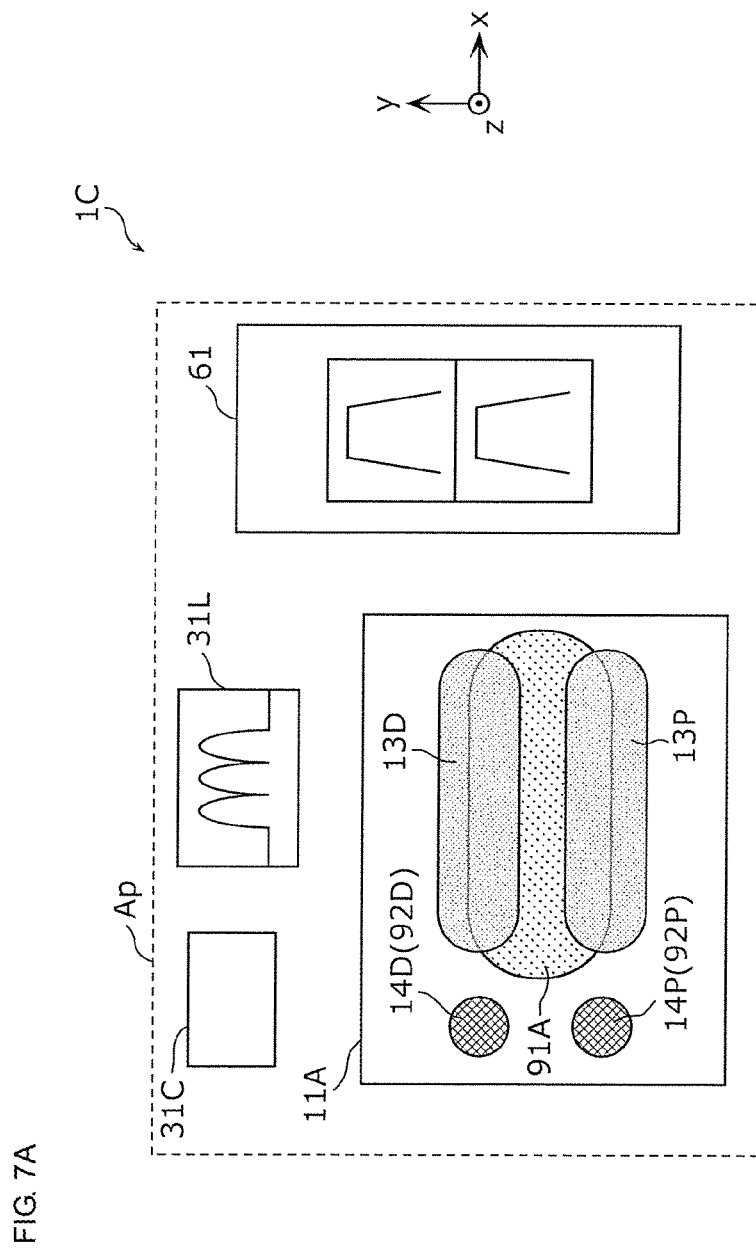
FIG. 7A is a schematic plan view illustrating a fourth mounting arrangement of a power amplifier included in a high frequency module according to the modified example 3 of an embodiment.

FIG. 7A is a schematic plan view illustrating a fourth mounting arrangement of the transmission power amplifier 11A included in a high frequency module 1C according to a modified example 3 of the embodiment. This figure is a plan view illustrating the fourth mounting arrangement on the principal surface 90a of the area Ap where the transmission power amplifier 11A according to the present modified example is mounted. The high frequency module 1C according to the present modified example is connected to a principal surface of the transmission power amplifier 11A and includes, in the plan view of this principal surface, an elongated-shape bump electrode 13P, an elongated-shape bump electrode 13D, a substantially circular bump electrode 14P, and a substantially circular bump electrode 14D.

Further, the mounting board 90 includes, in the plan view of the mounting board 90, an elongated-shape via conductor 91A and substantially circular via conductors 92P and 92D.

Here, the emitter terminal 112P is connected to the bump electrode 13P and to the ground via the bump electrode 13P and the via conductor 91A. Further, the emitter terminal 112D is connected to the bump electrode 13D and to the ground via the bump electrode 13D and the via conductor 91A.

As illustrated in FIG. 7A, the length direction of the bump electrode 13P and the length direction of the via conductor 91A are aligned in the foregoing plan view, and the bump electrode 13P and the via conductor 91A are connected in an overlapping area where the bump electrode 13P and the via conductor 91A overlap at least partially in the foregoing plan view. The overlapping area is an area elongated in the foregoing length direction. Here, "the overlapping area elongated in the foregoing length direction" is an area where an area of the bump electrode 13P elongated in the foregoing length direction, out of the area of the bump electrode 13P in the foregoing plan view, and an area of the via conductor 91A elongated in the foregoing length direction, out of the area of the via conductor 91A in the foregoing plan view, overlap. Further, the length direction of the bump electrode 13D and the length direction of the via conductor 91A are aligned in the foregoing plan view, and the bump electrode 13D and the via conductor 91A are connected in an overlapping area where the bump electrode 13D and the via conductor 91A overlap, the overlapping area being elongated at least in the foregoing length direction in the foregoing plan view. Here, "the overlapping area elongated in the foregoing length direction" is an area where an area of the bump electrode 13D elongated in the foregoing length direction, out of the area of the bump electrode 13D in the foregoing plan view, and an area of the via conductor 91A elongated in the foregoing length direction, out of the area of the via conductor 91A in the foregoing plan view, overlap. Further, "the length directions are aligned" is not limited to the state where the length direction of the via conductor 91A and the length direction of the bump electrode 13P are substantially parallel to each other, but also includes the state where an angle formed by the length direction of the via conductor 91A and the length direction of the bump electrode 13P is equal to or less than 45 degrees.

Further, the bump electrode 14P is connected to the substantially circular via conductor 92P while overlapping each other in the foregoing plan view, and the bump electrode 14D is connected to the substantially circular via conductor 92D while overlapping each other in the foregoing plan view.

That is, in the fourth mounting arrangement according to the present modified example, the high frequency module 1C includes the transmission power amplifier 11A, the bump electrode 13P having an elongated shape and the bump electrode 13D having an elongated shape in the foregoing plan view, and the mounting board 90, the mounting board 90 includes the via conductor 91A having an elongated shape in the foregoing plan view, the length direction of the bump electrode 13P and the length direction of the via conductor 91A are aligned in the foregoing plan view, and the bump electrode 13P and the via conductor 91A are connected in the overlapping area where the bump electrode 13P and the via conductor 91A overlap at least partially. Here, the overlapping area is an area elongated in the foregoing length direction.

According to this, of a plurality of the amplifier transistors 110D and 110P, the amplifier transistor 110P having the highest output power is connected to the elongated-shape bump electrode 13P and the elongated-shape via conductor 91A. Further, the elongated-shape bump electrode 13P and the elongated-shape via conductor 91A are connected in such a way that the bump electrode 13P and the via conductor 91A overlap along their length directions in the foregoing plan view. Therefore, compared with the related art, the contact area between the bump electrode 13P and the via conductor 91A becomes larger. Accordingly, the heat dissipation of the transmission power amplifier 11A is achieved effectively. Note that, in the fourth mounting arrangement according to the present modified example, in addition to connecting the power-stage amplifier transistor 110P to the ground via the elongated-shape bump electrode 13P and the elongated-shape via conductor 91A, the drive-stage amplifier transistor 110D is connected to the ground via the elongated-shape bump electrode 13D and the elongated-shape bump electrode 91A. This enables to maximize the heat dissipation ability of the high frequency module 1C.

Further, according to the fourth mounting arrangement of the present modified example, in the foregoing plan view, the bump electrode 13P and the bump electrode 13D, each partially overlaps the via conductor 91A and further overlaps the non-conducting part of the mounting board 90 at the remaining part. That is, it becomes possible to ensure the flatness of the transmission power amplifier 11A on the mounting board 90 by connecting the bump electrode 13P and the bump electrode 13D to the non-conducting part while improving the heat dissipation ability of the high frequency module 1C by connecting the bump electrode 13P and the via conductor 91A.

Further, since a heat dissipating position in the mounting board 90 can be concentrated in one via conductor 91A, a heat dissipating range of the high frequency module 1C is reduced.

Figure 7B:
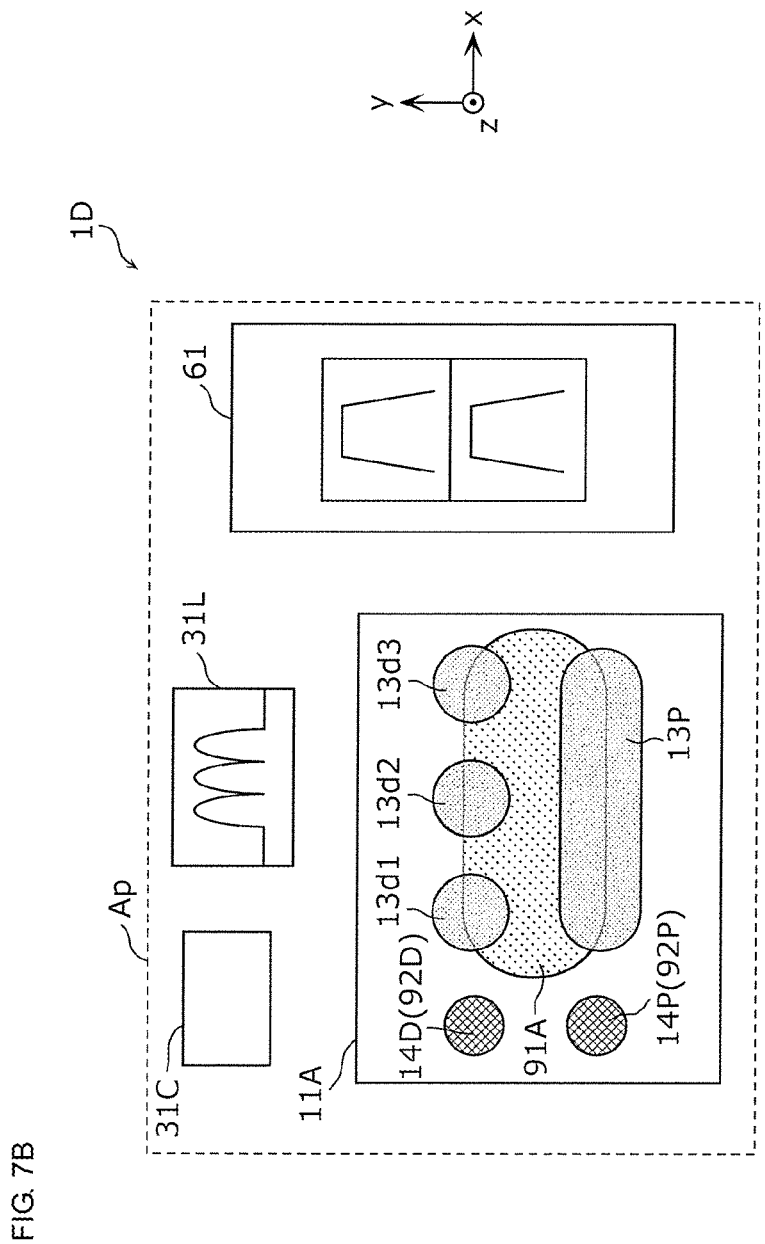
FIG. 7B is a schematic plan view illustrating a fifth mounting arrangement of a power amplifier included in a high frequency module according to a modified example 4 of an embodiment.

FIG. 7B is a schematic plan view illustrating a fifth mounting arrangement of the transmission power amplifier 11A included in a high frequency module 1D according to a modified example 4 of the embodiment. This figure is a plan view illustrating the fifth mounting arrangement on the principal surface 90$a$ of the area Ap where the transmission power amplifier 11A according to the present modified example is mounted. The high frequency module 1D according to the present modified example is connected to a principal surface of the transmission power amplifier 11A and includes, in the plan view of this principal surface, an elongated-shape bump electrode 13P, substantially circular bump electrodes 13$d$1, 13$d$2, and 13$d$3, a substantially circular bump electrode 14P, and a substantially circular bump electrode 14D.

Further, the mounting board 90 includes, in the plan view of the mounting board 90, an elongated-shape via conductor 91A and substantially circular via conductors 92P and 92D.

Compared with the fourth mounting arrangement according to the third modified example, the fifth mounting arrangement according to the present modified example is different only in the configuration of the bump electrode connected to the emitter terminal 112D of the drive-stage amplifier transistor 110D. The fifth mounting arrangement according to the present modified example is described below with the emphasis on the difference from the fourth mounting arrangement according to the modified example 3.

The bump electrodes 13$d$1, 13$d$2, and 13$d$3 are discretely arranged along the length direction of the via conductor 91A with predetermined gaps therebetween.

Here, the emitter terminal 112P is connected to the bump electrode 13P and to the ground via the bump electrode 13P and the via conductor 91A. Further, the emitter terminal 112D is connected to the bump electrodes 13$d$1, 13$d$2, and 13$d$3 and to the ground via the bump electrodes 13$d$1 to 13$d$3 and the via conductor 91A.

As illustrated in FIG. 7B, the length direction of the bump electrode 13P and the length direction of the via conductor 91A are aligned in the foregoing plan view, and the bump electrode 13P and the via conductor 91A are connected in an overlapping area where the bump electrode 13P and the via conductor 91A overlap at least partially in the foregoing plan view. The overlapping area is an area elongated in the foregoing length direction. Further, the bump electrode 13$d$1 and the via conductor 91A are connected by at least partially overlapping each other in the foregoing plan view. The bump electrode 13$d$2 and the via conductor 91A are connected by at least partially overlapping each other in the foregoing plan view. The bump electrode 13$d$3 and the via conductor 91A are connected by at least partially overlapping each other in the foregoing plan view.

That is, in the fifth mounting arrangement according to the present modified example, the high frequency module 1D includes the transmission power amplifier 11A, the bump electrode 13P having an elongated shape and the bump electrodes 13$d$1 to 13$d$3 each having an elongated shape in the foregoing plan view, and the mounting board 90, the mounting board 90 includes the via conductor 91A having an elongated shape in the foregoing plan view, the length direction of the bump electrode 13P and the length direction of the via conductor 91A are aligned in the foregoing plan view, and the bump electrode 13P and the via conductor 91A are connected in the overlapping area where the bump electrode 13P and the via conductor 91A overlap at least partially. Here, the overlapping area is an area elongated in the foregoing length direction.

According to this, of a plurality of the amplifier transistors 110D and 110P, the amplifier transistor 110P having the highest output power is connected to the elongated-shape bump electrode 13P and the elongated-shape via conductor 91A. Further, the elongated-shape bump electrode 13P and the elongated-shape via conductor 91A are connected in such a way that the bump electrode 13P and the via conductor 91A overlap along their length directions in the foregoing plan view. Therefore, compared with the related art, the contact area between the bump electrode 13P and the via conductor 91A becomes larger. Accordingly, the heat dissipation of the high frequency module 1D is achieved effectively.

Further, according to the foregoing fifth mounting arrangement, in the foregoing plan view, the bump electrode 13P and the bump electrodes 13$d$1 to 13$d$3 each partially overlaps the via conductor 91A and further overlap the non-conducting part of the mounting board 90 at the remaining part. That is, it becomes possible to ensure the flatness of the transmission power amplifier 11A on the mounting board 90 by connecting the bump electrode 13P and the bump electrodes 13$d$1 to 13$d$3 to the non-conducting part while improving the heat dissipation ability of the high frequency module 1D by connecting the bump electrode 13P and the via conductor 91A.

Note that, although the configuration including two stages of the amplifier transistors 110P and 110D are described as the transmission power amplifier 11A according to the modified example 3 and the modified example 4, the number of cascading-connected amplifier transistors is not limited to two stages but may alternatively be three stages or more. In this case, the power-stage amplifier transistor is an amplifier transistor in the last stage, and the drive-stage amplifier transistor is an amplifier transistor in one of preceding stages previous to the last stage.

Note that, in the high frequency modules according to the foregoing embodiment and the modified examples thereof, the elongated-shape bump electrode 13 (or 13P) is a bump electrode connected to the transmission power amplifier 11 (or 11A). Alternatively, the elongated-shape bump electrode 13 may be a bump electrode connected to the transmission power amplifier 12 or may be a bump electrode connected to the reception low-noise amplifier 21 or 22. Further, the bump electrode 13 may not be connected to an active element generating heat such as the transmission power amplifier or the reception low-noise amplifier but may be connected to a passive element such as the transmission filter 61T, 62T, 63T or 64T, which is connected to an output terminal of an amplifier.

Other Embodiments

The high frequency module and the communication device according to the present embodiment are described using the embodiment and the modified examples thereof. However, the high frequency module and the communication device according to the present disclosure are not limited to the foregoing embodiment and the modified examples thereof. Other embodiments realized by combining arbitrary constituting elements of the foregoing embodiment and the modified examples thereof, modified examples obtained by applying various modifications apparent to those skilled in the art to the foregoing embodiment and the modified examples thereof without necessarily departing the scope of the present disclosure, and various devices including the foregoing high frequency module and the foregoing communication device may also be included in the present disclosure.

For example, in the high frequency modules and the communication devices according to the foregoing embodiment and the modified examples thereof, another circuit element or wiring or the like may be inserted in a path connecting a circuit element and a signal path disclosed in the drawings.

The present disclosure can be widely used in communication devices such as cellular phones and the like as a high frequency module to be installed in a multiband front-end unit.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A high frequency module comprising:
   a high frequency component;
   a first bump electrode connected to the high frequency component, the first bump electrode having an elongated shape in a plan view of the high frequency component; and
   a mounting board on which the high frequency component is mounted, wherein
   the mounting board includes a via conductor having an elongated shape in a plan view of the mounting board,
   a length direction of the first bump electrode and a length direction of the via conductor are aligned in the plan view, and the first bump electrode and the via conductor are connected in an overlapping area where the first bump electrode and the via conductor overlap at least partially in the plan view, and
   the overlapping area is an area elongated in the length direction.

2. The high frequency module according to claim 1, wherein
   the high frequency component is at least one of a power amplifier, a low-noise amplifier, and a filter connected to an output terminal of a power amplifier.

3. The high frequency module according to claim 1, wherein
   the high frequency component is a power amplifier and includes a bipolar transistor having a base terminal, a collector terminal, and an emitter terminal, in which a drive current flows from the collector terminal to the emitter terminal, and
   the emitter terminal is connected to ground via the first bump electrode and the via conductor.

4. The high frequency module according to claim 3, further comprising:
   a second bump electrode connected to a principal surface of the high frequency component, wherein
   the second bump electrode is connected to at least one of the base terminal and the collector terminal, and
   in the plan view, an area of the first bump electrode is larger than an area of the second bump electrode.

5. The high frequency module according to claim 1, wherein
   the high frequency component is a power amplifier and includes a field effect type transistor having a gate terminal, a drain terminal, and a source terminal, in which a drive current flows from the drain terminal to the source terminal, and
   the source terminal is connected to ground via the first bump electrode and the via conductor.

6. The high frequency module according to claim 5, further comprising:
   a second bump electrode connected to a principal surface of the high frequency component, wherein
   the second bump electrode is connected to at least one of the gate terminal and the drain terminal, and
   in the plan view, an area of the first bump electrode is larger than an area of the second bump electrode.

7. The high frequency module according to claim 1, wherein
   the high frequency component is a power amplifier made up of a plurality of amplifier elements forming a cascading connection with one another,
   the plurality of amplifier elements includes
      a first amplifier element disposed in a last stage of the plurality of amplifier elements, and
      a second amplifier element disposed in a preceding stage previous to the first amplifier element, and
   the first bump electrode is connected to a terminal of the first amplifier element.

8. The high frequency module according to claim 1, wherein
   the first bump electrode is a columnar electrode whose main component is copper.

9. The high frequency module according to claim 1, wherein
   the mounting board further includes a non-conducting part in contact with a periphery of the via conductor, the non-conducting part being a main body of the mounting board,
   the first bump electrode includes, in the plan view, an area where the first bump electrode does not overlap the via conductor but overlaps the non-conducting part.

10. A communication device comprising:
    a RF signal processing circuit that processes a high frequency signal received or to be transmitted from an antenna element; and
    a frequency module according to claim 1, the high frequency module transmitting the high frequency signal between the antenna element and the RF signal processing circuit.

11. The high frequency module according to claim 2, wherein
    the high frequency component is a power amplifier and includes a bipolar transistor having a base terminal, a collector terminal, and an emitter terminal, in which a drive current flows from the collector terminal to the emitter terminal, and
    the emitter terminal is connected to ground via the first bump electrode and the via conductor.

12. The high frequency module according to claim 2, wherein
    the high frequency component is a power amplifier and includes a field effect type transistor having a gate terminal, a drain terminal, and a source terminal, in which a drive current flows from the drain terminal to the source terminal, and
    the source terminal is connected to ground via the first bump electrode and the via conductor.

13. The high frequency module according to claim 2, wherein
the high frequency component is a power amplifier made up of a plurality of amplifier elements forming a cascading connection with one another,
the plurality of amplifier elements includes
a first amplifier element disposed in a last stage of the plurality of amplifier elements, and
a second amplifier element disposed in a preceding stage previous to the first amplifier element, and
the first bump electrode is connected to a terminal of the first amplifier element.

14. The high frequency module according to claim 3, wherein
the high frequency component is a power amplifier made up of a plurality of amplifier elements forming a cascading connection with one another,
the plurality of amplifier elements includes
a first amplifier element disposed in a last stage of the plurality of amplifier elements, and
a second amplifier element disposed in a preceding stage previous to the first amplifier element, and
the first bump electrode is connected to a terminal of the first amplifier element.

15. The high frequency module according to claim 4, wherein
the high frequency component is a power amplifier made up of a plurality of amplifier elements forming a cascading connection with one another,
the plurality of amplifier elements includes
a first amplifier element disposed in a last stage of the plurality of amplifier elements, and
a second amplifier element disposed in a preceding stage previous to the first amplifier element, and
the first bump electrode is connected to a terminal of the first amplifier element.

16. The high frequency module according to claim 5, wherein
the high frequency component is a power amplifier made up of a plurality of amplifier elements forming a cascading connection with one another,
the plurality of amplifier elements includes
a first amplifier element disposed in a last stage of the plurality of amplifier elements, and
a second amplifier element disposed in a preceding stage previous to the first amplifier element, and
the first bump electrode is connected to a terminal of the first amplifier element.

17. The high frequency module according to claim 6, wherein
the high frequency component is a power amplifier made up of a plurality of amplifier elements forming a cascading connection with one another,
the plurality of amplifier elements includes
a first amplifier element disposed in a last stage of the plurality of amplifier elements, and
a second amplifier element disposed in a preceding stage previous to the first amplifier element, and
the first bump electrode is connected to a terminal of the first amplifier element.

18. The high frequency module according to claim 2, wherein
the first bump electrode is a columnar electrode whose main component is copper.

19. The high frequency module according to claim 3, wherein
the first bump electrode is a columnar electrode whose main component is copper.

20. The high frequency module according to claim 4, wherein
the first bump electrode is a columnar electrode whose main component is copper.

* * * * *